United States Patent
Lipp et al.

(10) Patent No.: US 8,000,103 B2
(45) Date of Patent: Aug. 16, 2011

(54) COOLING SYSTEM FOR CONTACT COOLED ELECTRONIC MODULES

(75) Inventors: Robert J. Lipp, Los Gatos, CA (US); Phillip P. Hughes, Menlo Park, CA (US)

(73) Assignee: Clustered Systems Company, Santa Clara, CA (US)

( * ) Notice: Subject to any disclaimer, the term of this patent is extended or adjusted under 35 U.S.C. 154(b) by 93 days.

(21) Appl. No.: 12/339,583

(22) Filed: Dec. 19, 2008

(65) Prior Publication Data

US 2009/0159241 A1   Jun. 25, 2009

Related U.S. Application Data

(60) Provisional application No. 61/008,136, filed on Dec. 19, 2007.

(51) Int. Cl.
*H05K 7/20* (2006.01)
*G06F 1/20* (2006.01)

(52) U.S. Cl. ............ 361/702; 361/679.47; 361/679.52; 361/679.53; 361/699; 361/704; 361/715; 361/716; 361/720; 361/721; 361/727; 165/80.2; 165/104.33; 165/185

(58) Field of Classification Search ............ 361/679.46, 361/679.53, 688–690, 699, 702, 704, 707, 361/715–716, 720–721, 724–727; 165/80.2–80.4, 165/104.33, 185
See application file for complete search history.

(56) References Cited

U.S. PATENT DOCUMENTS

| | | | | |
|---|---|---|---|---|
| 4,733,720 A | * | 3/1988 | Havranek et al. ............ | 165/80.4 |
| 5,457,603 A | * | 10/1995 | Leeb ............................ | 361/698 |
| 5,740,018 A | * | 4/1998 | Rumbut, Jr. .................. | 361/720 |
| 5,818,692 A | * | 10/1998 | Denney et al. ............... | 361/699 |
| 6,393,853 B1 | * | 5/2002 | Vukovic et al. .............. | 62/259.2 |
| 6,853,554 B2 | * | 2/2005 | Bash et al. .................... | 361/699 |
| 6,882,533 B2 | * | 4/2005 | Bash et al. .................... | 361/696 |
| 7,096,926 B2 | | 8/2006 | Belady et al. | |
| 7,167,366 B2 | * | 1/2007 | Cheon .......................... | 361/699 |
| 7,212,409 B1 | * | 5/2007 | Belady et al. ................ | 361/721 |
| 7,250,674 B2 | | 7/2007 | Inoue | |
| 7,286,355 B2 | * | 10/2007 | Cheon .......................... | 361/699 |

(Continued)

FOREIGN PATENT DOCUMENTS

JP    03070197 A   *   3/1991

(Continued)

OTHER PUBLICATIONS

Chu et al., "Three-Dimensional Circuit Package With Water-Cooled Cold PLate and Pairs of Metal Fins Extending Between Facing Rows of Compenents", IBM Technical Disclosure, Jul. 1986, p. 734.*

(Continued)

*Primary Examiner* — Robert J Hoffberg

(74) *Attorney, Agent, or Firm* — Jeffrey Schox

(57) ABSTRACT

Various embodiments disclose a system and method to provide cooling to electronic components, such as electronic modules or the like. The system includes one or more cold plates that are configured to be thermally coupled to one or more of the electronic components. Internally, each of the cold plates has a cooling fluid flowing inside of at least one passageway. The cooling fluid thus removes heat from the electronic components primarily by conductive heat transfer. An input and an output header are attached to opposite ends of the passageway to allow entry and exit of the cooling fluid. The input and output headers are attached to an external system to circulate the cooling fluid.

38 Claims, 7 Drawing Sheets

U.S. PATENT DOCUMENTS

| | | | |
|---|---|---|---|
| 7,312,987 B1 * | 12/2007 | Konshak | 361/679.48 |
| 7,552,758 B2 * | 6/2009 | Garner et al. | 165/80.4 |
| 2004/0221604 A1 | 11/2004 | Ota et al. | |

FOREIGN PATENT DOCUMENTS

| | | | |
|---|---|---|---|
| JP | 03070198 A | * | 3/1991 |
| JP | 03159160 A | * | 7/1991 |
| JP | 2002/280782 | | 9/2002 |
| JP | 2002280782 A | * | 9/2002 |
| RU | 2338345 C1 | * | 11/2008 |

OTHER PUBLICATIONS

"International Application Serial No. PCT/US2008/013880, International Search Report mailed Feb. 17, 2009", 4 pgs.

"International Application Serial No. PCT/US2008/013880, Written Opinion mailed Feb. 17, 2009", 5 pgs.

* cited by examiner

COOLING SYSTEM FOR CONTACT COOLED ELECTRONIC MODULES

CROSS-REFERENCE TO RELATED APPLICATIONS

This application claims priority benefit of U.S. Provisional Application No. 61/008,136, entitled, "A Cooling System for Contact Cooled Electronic Modules," filed Dec. 19, 2007, which is hereby incorporated by reference in its entirety.

TECHNICAL FIELD

The present application relates generally to the cooling of compute and storage systems; and, in a specific exemplary embodiment, to a system and method of cooling modularly deployed systems without the use of forced air.

BACKGROUND

Enterprise compute and storage systems are increasingly deployed as modular systems with standardized form factor electronic enclosure modules mounted in standardized support structures. The standardized electronic enclosure modules may be devoted to perform any of a number of different functions such as computing, storage, or networking. The enclosure modules are commonly mounted in standardized support structures such as 19 inch (approximately 0.482 m) or 24 inch (approximately 0.610 m) wide racks. Such enclosures are commonly industry standard 1 U (1.75 inch; approximately 4.45 cm), 2 U (3.5 inch; approximately 8.89 cm), 3 U (5.25 inch; approximately 13.3 cm), or 4 U (7 inch; approximately 17.8 cm) high. Often, the reasons for the adoption of the larger 2 U, 3 U, or 4 U modules is to increase reliability through improved airflow for cooling and to provide space for more adapter cards.

Such modular enclosures are customarily air-cooled. They draw air in from the room they are housed in by means of fans that accelerate the air and force it over the enclosure's internal components to cool them. The resulting heated air is exhausted back into the room. The room air itself is circulated through an air cooler or a Computer Room Air Conditioner (CRAC) that is, in turn, cooled by a refrigeration system. Even for moderately powered systems, very large volumes of air must be moved from the room through the modules, racks, and CRACs. Fans commonly account for 25% of the total power consumed in the modules and racks. CRAC fans consume another 0.1 watt per watt of load. This cooling burden is passed to the refrigeration system that consumes another 0.3 to 0.4 watts per watt of load. The latter load might be increased by hot and cold air mixing in the room, further reducing cooling efficiency. All these effects, together with electrical power conversion and distribution losses, require that, for every watt of power consumed by the computing section of a server, typically 2.8 watts must be supplied to a modern best-in-class data center. In many data centers, up to 4 watts must be supplied.

In spite of the large amount of energy expended on moving the air, the thermal resistance from the electronic devices internal to a modular electronic enclosure to the cooling fluid passing through the air coolers is still excessively high, typically 0.5° C./watt to 0.7° C./watt. This results in a large temperature drop from the devices to the cooling fluid. For example, a 120 watt processor with a path having a thermal resistance of 0.5° C./watt to the cooling fluid produces a thermal drop of 60° C. In order to maintain a device case temperature of 70° C., the cooling fluid temperature cannot be higher than 10° C. This requires a refrigeration cycle that absorbs considerable energy.

If the thermal resistance could be lowered then the temperature of the cooling fluid could be increased resulting in an improvement of the thermal efficiency of the entire cooling infrastructure. In some cases, the permissible temperature of the cooling fluid could be increased sufficiently for the refrigeration system to be replaced by a natural cooling system such as that provided by the evaporation of water in a cooling tower or dissipation to groundwater.

Although fluids are sometimes used in cooling electronics, no fully integrated, modular, reliable, simple, and cost effective solution has emerged. Issues to overcome include: difficult installation and maintenance; modularity and scalability; decreased reliability due to numerous fluid connections; difficulty in applying the technology to existing products and environments; and establishing a low thermal impedance path from the device-to-be-cooled to an external chiller.

BRIEF DESCRIPTION OF DRAWINGS

Various ones of the appended drawings merely illustrate exemplary embodiments of the present invention and must not be considered as limiting its scope.

DETAILED DESCRIPTION

Figure 1A:
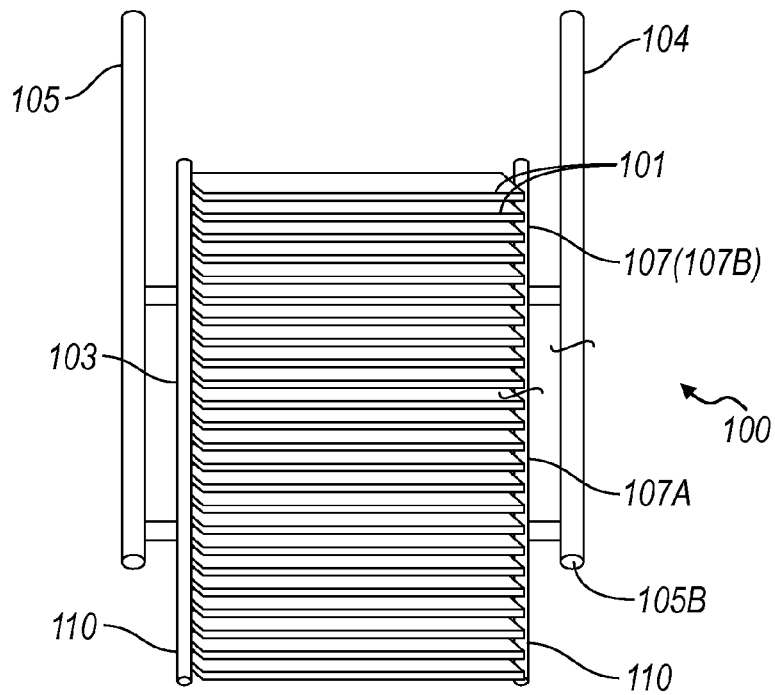
FIG. 1A is a front elevational view of an exemplary cooling framework.

The description that follows includes illustrative systems, methods, and techniques that cover various exemplary embodiments defined by the present disclosure. In the following description, for purposes of explanation, numerous specific details are set forth in order to provide an understanding of various embodiments of the inventive subject matter. It will be evident, however, to those skilled in the art that embodiments of the inventive subject matter may be practiced without these specific details. Further, well-known instruction instances, protocols, structures, and techniques have not been shown in detail.

As used herein, the term "or" may be construed in an inclusive or exclusive sense. Similarly, the term "exemplary" may be construed merely to mean an example of something or an exemplar and not necessarily a preferred means of accomplishing a goal. Additionally, although various exemplary embodiments discussed below focus on a thermal cooling system for electronic components, the embodiments are merely given for clarity in disclosure. Thus, any type of thermal cooling application is considered as being within a scope of the present invention.

Overview

A fluid cooled system fully integrated with its environment that removes heat from the computer and is directly connected to a remote chiller eliminates many of the problems associated with air as the cooling medium. The energy required to run the fans is eliminated, reducing a data center's energy cost 30% or more. Compute density can be increased to near physical limits, limited only by the requirements of accessibility. A fluid cooled system has little effect on the ambient conditions of its surroundings and is potentially much quieter than an air cooled system. Neither special room configuration modifications nor room cooling are necessary when changing equipment dispositions. Large data processing systems can be deployed in environments where it was previously not possible to do so because of their adverse heat and noise emissions.

For the purposes of the description of the present disclosure, the term "fluid" includes conventional liquids such as water and phase change refrigerant fluids that may be in a liquid, a gaseous, or a liquid-gas mixture state. In the simplest case, fluid may be employed to move heat from a location hard to cool with air to a place that is easy to cool.

In an exemplary embodiment, a system to provide cooling to electronic components, such as electronic modules or the like, is disclosed. The system includes one or more cold plates that are thermally coupled to one or more of the electronic components. Internally, each of the cold plates has a cooling fluid flowing inside at least one passageway. The cooling fluid thus removes heat from the electronic components primarily by conductive heat transfer. An input and an output header is attached to opposite ends of the passageway to allow entry and exit of the cooling fluid. The input and output headers are attached to an external system to circulate the cooling fluid.

In another exemplary embodiment, a flexible cold plate arrangement is disclosed that allows electronic modules to be cooled primarily by conductive heat transfer. The flexible cold plate includes a plurality of tubes adjacently coupled to one another, forming a substantially planar structure. The plurality of tubes are arranged to allow a cooling fluid to flow internally. A first and second manifold is coupled to opposing ends of the plurality of tubes. The first and second manifolds connect to a circulation source to provide circulation of the cooling fluid within the plurality of tubes. The flexible cold plate is bent against the modules to provide a low thermal resistance.

In another exemplary embodiment, a method of cooling electronic equipment modules is disclosed. The method includes mounting each of the electronic equipment modules to at least one cold plate formed in a support structure so as to provide good thermal contact between the two components. The cold plate is connected to an external cooling system and cooling fluid is circulated between the external cooling system and internal passageways of the cold plate thus cooling the module primarily by conductive heat transfer.

In another exemplary embodiment, a method of cooling electronic equipment modules is disclosed. The method includes installing a thin flexible cold plate in proximity to the electronic module. The cold plate has spring-like properties to allow it to bend to present a convex surface towards the electronic module. The cold plate and the electronic module are then brought into thermal contact with one another by progressively flattening the convex surface against the electronic module.

Various embodiments of the present disclosure can make use of ambient air conditioning to maintain the cooling air at a temperature cool enough to cool the case. If many so equipped computers were employed in a data center, a large quantity of air would still have to be moved through the local chillers and room environment to maintain an air temperature that is low enough to cool the hot electronic components sufficiently. It would be advantageous to have a means to conduct this heat directly from the case to a fluid means for transport to a remote chiller.

Various embodiments of a cooling structure described herein are designed for use with, for example, a modular compute or other electronic system. The cooling structure comprises a support structure with cold plates that may be connected to a conventional data center refrigeration system through a fluid-to-fluid heat exchanger. The support structure may be based on a conventional 19" (approximately 0.483 m) equipment rack commonly used for housing compute servers and other electronic equipment. Such a support structure is adapted to contain a framework of hollow shelves through which cooling fluid circulates. The hollow shelves act as cold plates to which electronic equipment may be thermally attached for removal of waste heat primarily by thermal conduction.

Upon reading the disclosure given herein, a skilled artisan will recognize that other types of thermal cooling may occur by, for example, convective or radiative mechanisms as well depending upon the proximity of at least portions of the cold plate to the modular compute or other electronic system. The fluid is cooled in the heat exchanger and pumped to a manifold in the framework. The fluid is then directed to the cold plates via a series of subsidiary pipes and connectors. The fluid absorbs heat from the modules and exits the cold plates through other of the one or more connectors to a collection manifold and then to the heat exchanger.

The support structure has a means of inserting and removing electronic equipment modules ("modules") into and from the framework and bringing the modules into thermal contact with one or more cold plates. No plumbing connections are required to be made to insert or remove modules.

The modules are capable of being cooled primarily by conductive heat transfer to an external cold plate. The modules contain electronic components or subassemblies that thermally contact a side of the module that, in turn, contacts the cold plate. Alternatively, one side of the module may be open with the electronic components or subassemblies in direct thermal contact with the cold plate. As the contacting surfaces between the cold plate and module are never perfectly flat or coplanar, and may even be non-rigid and flexible, a compliant thermally conductive substance, such as a thermal grease, known independently in the art, or an elastomeric pad (generally referred to as a Thermal Interface Material (TIM), also known separately and independently in the art), may be inserted between the contacting surfaces.

The thermal resistance from the cooling fluid in the cold plates to the modules can be less than $2°$ C./W/in$^2$ (approximately $0.31°$ C./W/cm$^2$) over the thermal interface area between the module side and the cold plate fluid. A heat flux of 10 W/in$^2$ (approximately 1.55 W/cm$^2$) at the module side results in a maximum temperature rise of 20° C. For a module with a well constructed internal cooling system the module case temperature may be allowed to go as high as 50° C. The cooling fluid temperature may therefore be as high as 30° C., significantly reducing energy consumption. With engineering improvements, the fluid-to-module thermal resistance can be reduced to below $0.5°$ C./W/in$^2$ (approximately $0.078°$ C./W/cm$^2$), enabling further energy savings. In such a system, the refrigeration system could be replaced by a natural cooling system such as that provided by the evaporation of water in a cooling tower or dissipation to groundwater.

Equipment modules may be conventional electronic enclosures such as 1 U compute servers, other form-factor enclosures (sometimes referred to as chassis or pods), or unenclosed systems such as server blades or bare server motherboards. The side of the module to be cooled may be any side, but is assumed to be the top lid structure in the description herein.

The cooling fluid may be water, water glycol mix, a refrigerant such as R134A, or a variety of other coolant fluids known independently in the art. In the case of a refrigerant, the "cool" fluid entering the framework may be essentially the same temperature as the "hot" fluid exiting the framework, absorbing heat through a phase change rather than a temperature rise.

Framework

Figure 1B:
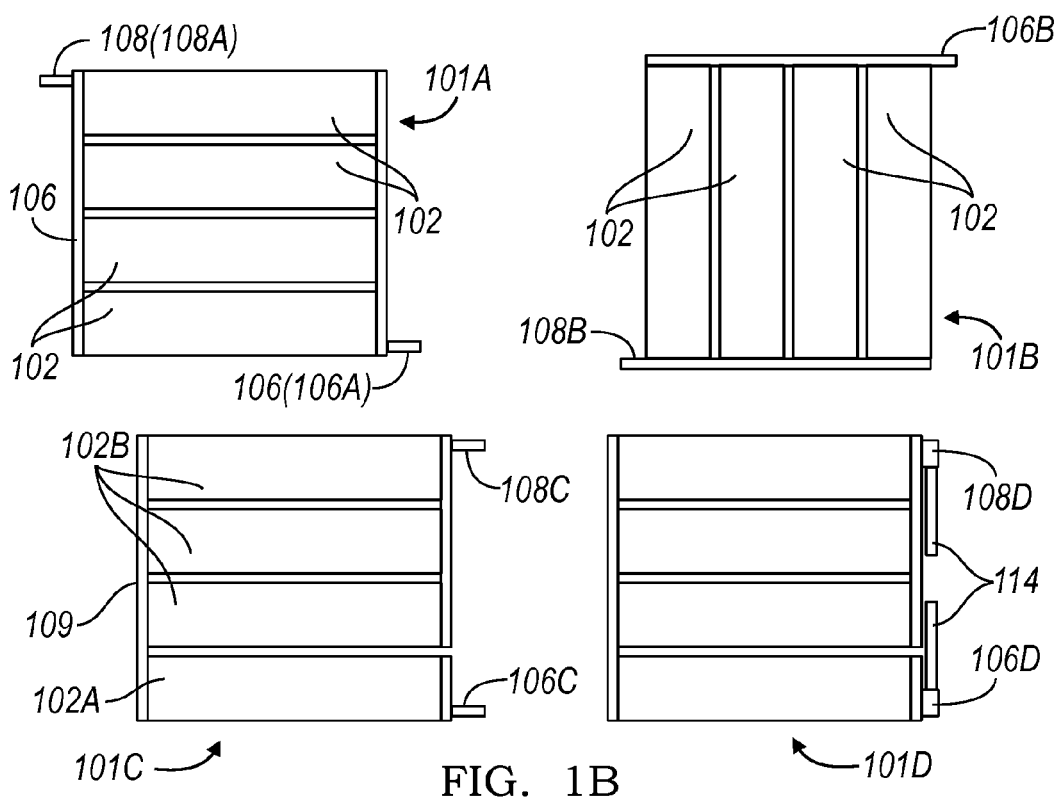
FIG. 1B shows four plan views of exemplary cold plates.

With reference now concurrently to FIGS. 1A and 1B, an exemplary cooling framework 100 comprises a plurality of cold plate shelves 101. In a specific exemplary embodiment, each of the plurality of cold plate shelves 101 is horizontal. However, there is no requirement for this particular orientation. Based upon the disclosure given herein, a skilled artisan will recognize how to appropriately modify other components as needed for other orientations.

Each of the plurality of cold plate shelves 101 is made up of one or more flat tubes 102 (FIG. 1B) arranged to be substantially coplanar. Each of the one or more flat tubes 102 comprises a segment of the cold plate shelf. The segments are interconnected and terminated by a first manifold pipe 106 (shown as embodiments 106A, 106B, 106C, 106D), and a second manifold pipe 108 (shown as embodiments 108A, 108B, 108C, 108D) that altogether comprise each cold plate. The one or more flat tubes 102 may be of a multi-port rectangular design comprising a plurality of smaller tubes attached together adjacently for strength and planarity when operating with high coolant pressures.

In an exemplary embodiment, the first manifold pipe 106 is connected to an input header 107 (FIG. 1A) and the second manifold pipe 108 to an output header 103 at the other end so as to permit cooling fluid injected into the input header 107 to flow to the output header 103. The input header 107 may further be subdivided into sections 107A, 107B as described below.

The input 107 and output 103 headers may be conventional pipes or manifolds into which the first 106 and second 108 manifolds may be inserted and welded or otherwise fixed in place to form leak-proof connections. Each of the input 107 and output 103 headers has an input connector 104 and an output connector 105 to pass coolant, respectively, to or from an external cooling system.

In another exemplary embodiment, the input header 107 may be subdivided into independent sections 107A, 107B such that both the input and output connections are made to the same header but through different sections. Fluid will pass from one header section through some of the tubes to the output header 103 and be returned to the second section of the input header 107 by other tubes. For example, if the input header 107 is divided into an independent top 107B and bottom 107A section, the input connection can be made to the top section 107B. Fluid flows through the top shelves to the output header 103 where it then travels through the bottom shelves back to the bottom section of the input header section 107A. From there, the fluid flows to the output connection 105B to the cooling system. One skilled in the art will recognize that there are many other possible variations and embodiments of divided headers and flow combinations, including opposite flow directions in different tubes within the same shelf. Such variations are intended to be included herein.

The output header 103 may be eliminated by bending each of the plurality of cold plate shelves 101 back upon itself making a "U" shaped structure lying sideways, creating two shelves; in such a case, the output header 103 is eliminated. Various options and alternative embodiments are readily imagined by one skilled in the art including serpentine structures with more than a single bend, thereby reducing the number of headers and manifolds required to build a system and reducing the number of assembly joints.

FIG. 1B illustrates top views of four exemplary embodiments 101A, 101B, 101C, 101D of the plurality of cold plate shelves 101. For a first embodiment 101A of the cold plate, the cold plate segments comprised of the one or more flat tubes 102 connect the first 106 and second 108 manifolds. The fluid enters a first manifold 106A via the input header 107, flows through all the cold plate segments, exiting the second manifold 108A at the output header 103. The fluid enters at one corner of the cold plate and exits the opposite corner to balance fluid flow among the cold plate segments. A cold plate in the second embodiment 101B is similar in construction to the cold plate of the first embodiment 101A, but is orthogonally mounted.

A cold plate may be constructed such that fluid flows into fewer than half the cold plate segments and then returns through a larger number of segments. This allows for expansion room for a refrigerant phase change from liquid to gas. In another exemplary embodiment 101C, fluid is directed into a tube 102B by an entrance manifold 106C. The fluid flows through the tube 102A to a manifold 109 where it is distributed to a plurality of additional tubes 102B and then to an exit manifold 108C. Although each of these cold plate embodiments show one to four plate segments, a skilled artisan will recognize that any number of plate segments may be employed.

In order to accommodate flexure of the cold plates without putting excessive strain on the input 107 or output 103 headers, flexible pipes 114 are added to the manifolds 106D, 108D of the cold plates in another exemplary embodiment 101D. The flexible pipes 114 are made of a flexible material and may include "U," "S," or other bend types (not shown) for further strain relief.

Figure 1C:
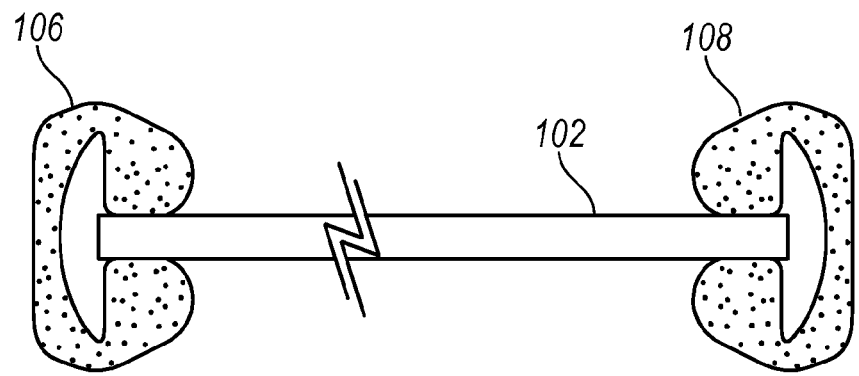
FIG. 1C is a front elevational detail view of an exemplary cold plate and manifold assemblies.

FIG. 1C is a detail front view cross-sectional drawing illustrating how one of the one or more flat tubes is inserted into the first 106 and second 108 manifold pipes.

Figure 1D:
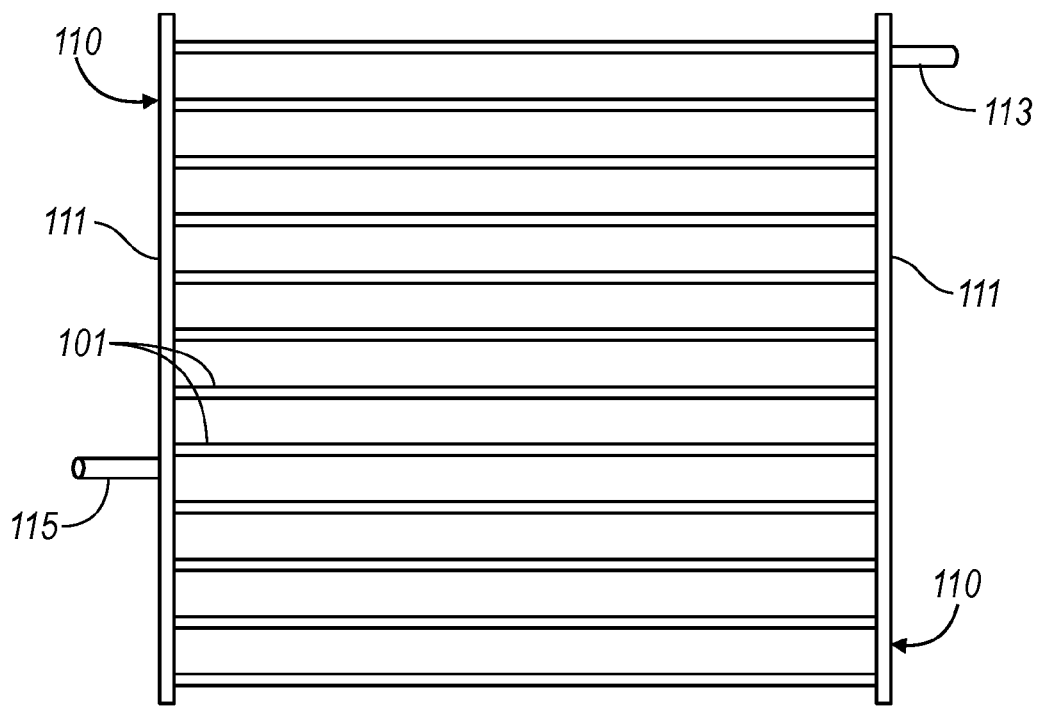
FIG. 1D is a front elevational view of an exemplary assembly of cold plates fabricated as a standalone cold frame.

With reference to a further embodiment shown in FIG. 1D, the output 103 and input 107 headers and the first 106 and second 108 manifolds are eliminated. The one or more flat tubes 102 that form the plurality of cold plate shelves 101 are placed in holes in braced metal boxes 111. This arrangement forms a rigid box with several tiers. The braced metal boxes 111 replace the output 103 and input 107 headers and the first 106 and second 108 manifolds. The braced metal boxes 111 each have an inlet 113 and an outlet connection 115 respectively on either side. One skilled in the art would understand that other methods of plate support and interconnection are possible and are thus considered herein.

If the output 103 and input 107 headers are replaced by rectangular boxes, certain areas 110 may have brackets (not shown) affixed to allow the mounting and cooling of additional auxiliary components or subsystems. The additional auxiliary components or subsystems can include items such as power supplies and network switches that have different form factors from the modules described herein and can also benefit from contact cooling.

Other various embodiments not shown, but readily envisioned by a skilled artisan upon reading the disclosure provided herein, include wider shelves to accommodate a plurality of modules or rotating the cooling framework such that the shelves are vertical and modules are mounted vertically instead of horizontally. Modules may also be mounted on both sides of a shelf to halve the number of shelves needed for a given application.

Module Dimensions

For standard 1 U server modules: 1.75 inches (approximately 4.45 cm) high by 19 inches (approximately 0.483 m) wide by 24 inches (approximately 0.610 m) deep, the shelves are placed on, for example, a 2 inch (approximately 5.08 cm) pitch. This pitch provides a vertical separation to accommodate thicknesses of the shelf, the module with a TIM attached to its top, and space to slide it into place without disturbing the TIM. Other module dimensions may be chosen for specific applications. A person skilled in the art would understand that modules with other dimensions could readily be used by adjusting the shelves accordingly. Because space for air cooling is not required internal to the modules, very thin modules may be developed with heights considerably less than 1.75 inches (approximately 4.45 cm), either to enable a standard 1 U module pitch, or to enable much denser compute and storage systems with less than a 2 inch (approximately 5.08 cm) pitch.

Module Insertion and Support Slides

Figure 2:
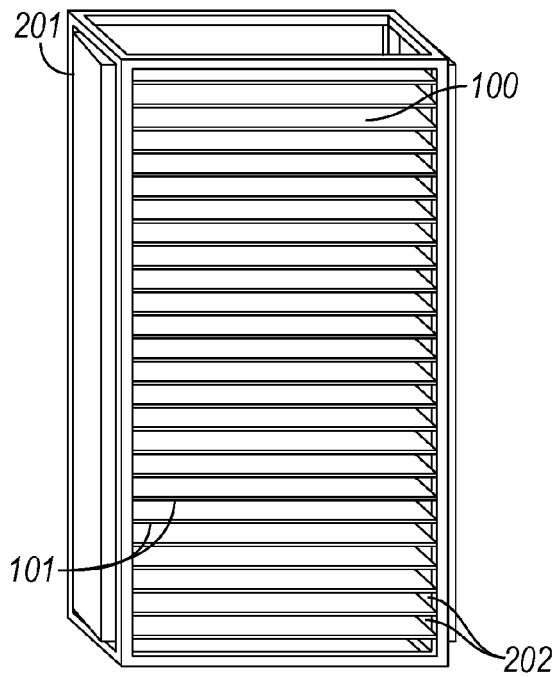
FIG. 2 is a perspective view of the exemplary cooling framework of FIG. 1A mounted in a conventional equipment support structure.

Referring now to FIG. 2, the exemplary cooling framework 100 is mounted into a conventional support structure 201. Note that each of the plurality of cold plate shelves 101 can be mounted to and supported by the equipment rack rather by the headers or braced metal sheets. In such a case, the conventional support structure becomes an integral part of the cold frame.

The support structure 201 is a simple metal frame structure comprising four uprights connected together by cross members at the tops and bottoms to form a hollow rectangular box. Drawer-type support slides 202 are attached on opposite sides of the support structure 201 between the front and rear upright members and below each of the plurality of cold plate shelves 101. Modules (not shown) are mounted on the drawer-type support slides 202 so that they can be readily slid horizontally in and out of the support structure 201.

The drawer-type support slides 202 may also be used to adjust the elevation of the module so that it fits tightly against the lower surface of an adjacent one of the plurality of cold plate shelves 101. Each module is slid completely in prior to being elevated to make contact with the shelf above it. Similarly, the module is lowered prior to removal. This assures smooth operation and eliminates possible damage to the TIM attached to the top side of the module by assuring the cold plates and TIM do not rub against each other during insertion or removal.

To install a module in the support structure 201, a module is first mounted on a pair of drawer-type support slides 202 in their fully extended position, out in front of the support structure 201. The pair of the drawer-type support slides 202 with the attached module are then slid back into the support structure 201 such that the module now resides directly below its respective cold plate shelf. The module is then lifted into its operating position against the cold plate by use of a lifting mechanism or the plates are brought down against the top of the module.

Figure 3A:
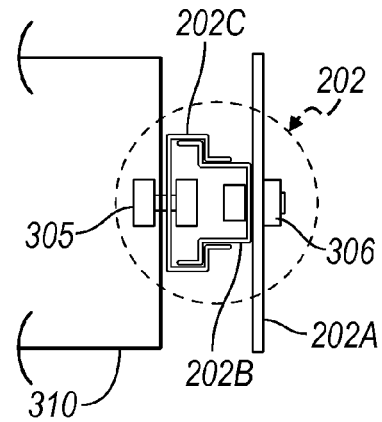
FIG. 3A is a front elevational view of a drawer slide mechanism used for inserting and elevating a module in the support structure.
Figure 3B:
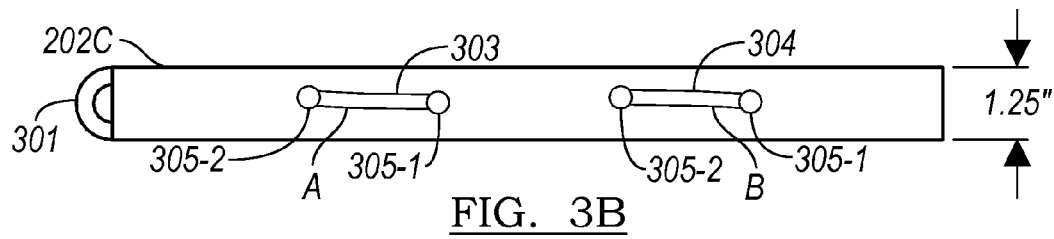
FIG. 3B is a side elevational view of the drawer slide mechanism of FIG. 3A.
Figure 3C:
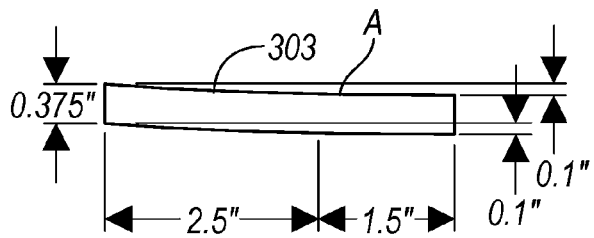
FIG. 3C is a side elevational view of slit A of the drawer slide mechanism of FIG. 3B.
Figure 3D:
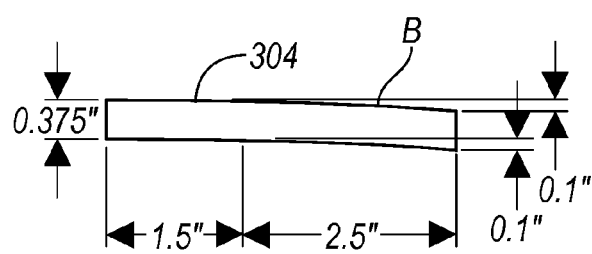
FIG. 3D is a side elevational view of slit B of the drawer slide mechanism of FIG. 3B.

A module lifting mechanism such as the modified drawer slide illustrated in FIGS. 3A and 3B may be employed, however, one skilled in the art would understand that there are many other mechanisms are possible and are included herein.

FIG. 3A illustrates a frontal cross-sectional view of a modified version of one of the drawer-type support slides 202 and its attachment to a module 310. The drawer-type support slide 202 comprises three elements: a support bracket 202A that is typically connected to the front and rear uprights of the support structure 201, a fixed slide rail section 202B that is affixed to the support bracket 202A by means of multiple fasteners 306, and a slide rail section 202C that is loosely affixed to the module 310 by means of multiple pins 305 inserted though exemplary slits 303, 304 in the slide rail section 202C of FIG. 3B. The multiple pins 305 are firmly affixed to the module 310 but are allowed to slide in the slits 303, 304.

The slits 303, 304 have a profile that define the vertical motion of the attached module 310 as a function of the horizontal motion of the slide rail section 202C relative to the module 310. Slit B lifts the module 310 immediately at the beginning of its travel and completes the vertical motion before its travel is complete. Slit A does not start lifting the module 310 until it is partway through its travel. These slits are, for example, 4 inches (approximately 10.2 cm) long and each slit lifts the module 310 0.1 inch (approximately 2.54 mm) in a different 2.5 inch (approximately 6.35 cm) section of that travel. The combined motions created by these two slits provide incremental contact, first raising the back of the module 310 and then the front of the module 310, pushing the air out of the space between the TIM on the top of the module 310 and an adjacent one of the plurality of cold plate shelves 101. When the module 310 is removed, the process is reversed, first lowering the front of the module 310 and then the rear. This motion, incrementally separating the module 310 from the adjacent one of the plurality of cold plate shelves 101 from front to back, helps overcome any adhesive forces between the module 310 and the cold plate with a minimum of force.

To insert the module 310 in the support structure 201, the slide rail section 202C is first mounted on the module 310 by inserting the multiple pins 305 through the slits 303, 304 and affixing to the module 310 such that the multiple pins 305 are in the rightmost positions 305-1 of slits 303, 304. At this point, the slide rail section 202C will protrude out in front of the module 310 by the length of the slits 303, 304. Each of the slide rail sections 202C with the attached module 310 is then engaged with the respective mating one of the fixed slide rail section 202B and slid fully into it such that the module 310 is fully within the support structure 201 and under the cold plate. At this point, the slide rail section 202C will still be extended out in front of the support structure 201 by the length of the slits 303, 304. The slide rail sections 202C on either side of the module 310 are then pushed back by handles 301, sliding on the multiple pins 305 to the leftmost position 305-2, thus raising the module 310.

Each of the multiple pins 305 may be any sort of, for example, pin, bolt spacer, or screw mechanism that provides a sliding surface while securing the slide rail section 202C to the module 310. Some or all of the multiple pins 305 may employ wheeled bearing means or low friction bushings such as nylon to facilitate a smooth sliding motion.

It can be readily observed by one skilled in the art, upon reading the present disclosure, that there are many obvious alternatives to the use of sliders as lifting mechanisms, such as rods with cams or screw mechanisms, that may be used to lever the module into place. Nothing in this description should be implied to exclude such mechanisms from this invention.

A vertical motion to press the module 310 firmly against the cold plate and the amount provided by a fixed mechanism will not always be the same. Therefore, a spring mechanism or other resilient structure may be provided to absorb the extra motion and forces exerted when the module 310 is lifted into place. There are many methods that can be employed such as, for example, metal springs, rubber-like grommets on supporting members, flexibility built into the supporting structures, the compliance of the TIM, or the flexibility of the cooling plate.

Figure 4A:
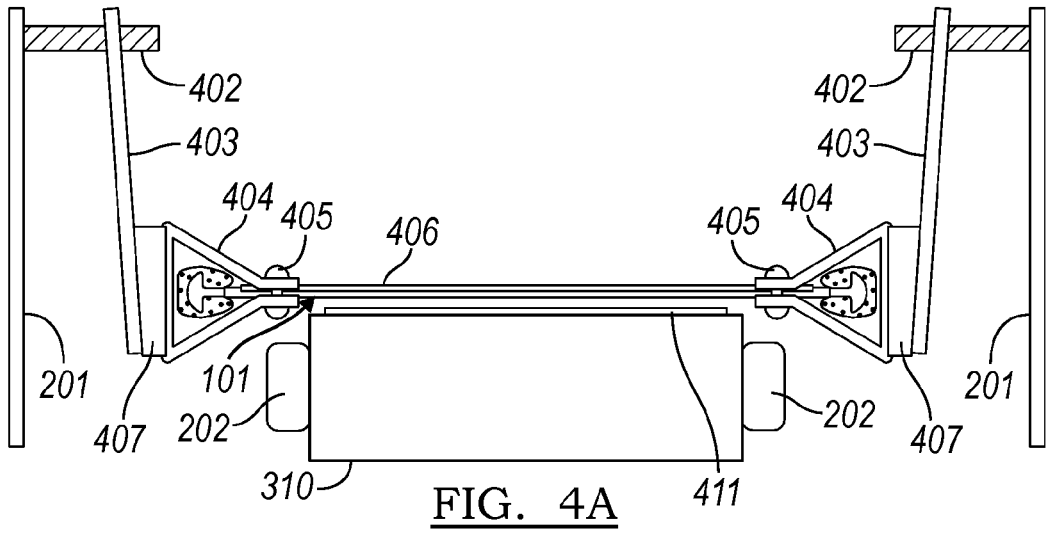
FIG. 4A shows a front view of an exemplary embodiment of a cold plate mechanism used to engage or disengage a module in a neutral flat position over the module.
Figure 4B:
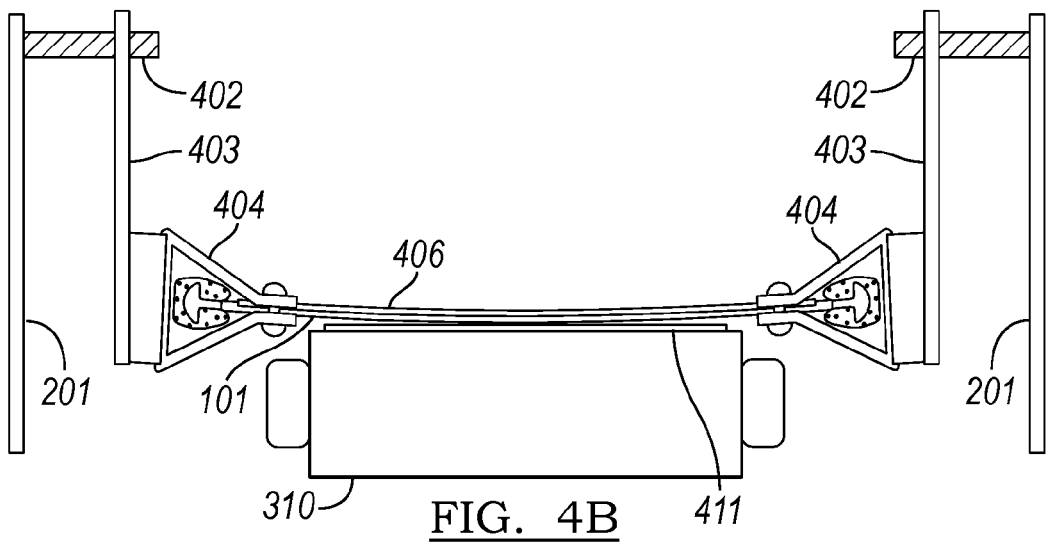
FIG. 4B shows a front view of an exemplary embodiment of a cold plate mechanism used to engage or disengage a module showing bending of the cold plate towards the module.
Figure 4C:
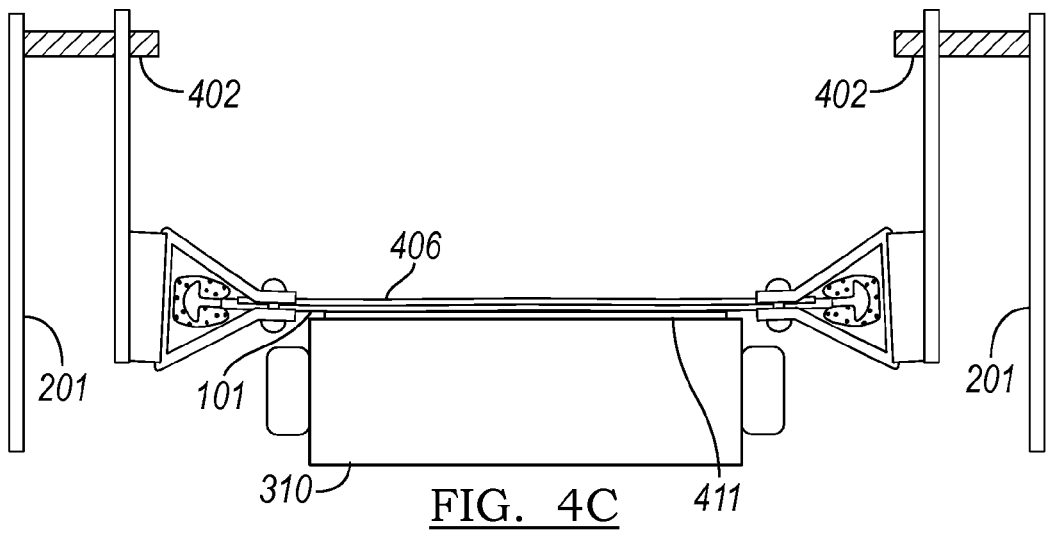
FIG. 4C shows a front view of an exemplary embodiment of a cold plate mechanism used to engage or disengage a module showing flattening of the cold plate as the module is pressed against it.

FIGS. 4A, 4B, and 4C illustrate various exemplary embodiments to achieve compliance and good thermal contact between the module 310 and adjacent ones of the plurality of cold plate shelves 101 by bending the cold plate shelf.

In this series of embodiments, the plurality of cold plate shelves 101 are flexible and are individually mounted on the support structure 201 via a variety of support and spring mechanisms including a plurality of hanging brackets 402, levers 403, mounting brackets 404, and spacing wedges 407. In FIG. 4A, the cold plate 101 comprises one or more flat tubes 102 fabricated from, for example, thin flat soft aluminum tubes that are about 0.08 inches (approximately 2.03 mm) thick that are easily flexed. A thin flexible steel plate 406 about 0.035 inches (approximately 0.889 mm) thick is clamped to the cold plate by means of the mounting brackets 404 and fasteners 405. The steel plate 406 acts as a flat spring, resisting bending deformation and providing structural strength to the aluminum cold plate. The mounting brackets 404 are further mounted on the spacing wedges 407 that are in turn mounted on the levers 403. The levers 403 are suspended from the hanging brackets 402 that are mounted onto the support structure 201. Moving the levers 403 apart along the hanging brackets 402 flexes the cold plate away from the module 310, while moving the levers 403 closer together flexes the cold plate down towards the module 310.

While a length of the levers 403 can be made less than the pitch of the shelves, it is advantageous to make them longer in order to reduce the horizontal forces applied to the support structure 201 that are required to bend the cold plate. The levers 403 are normally less than the height of two modules, about 3.5 inches (approximately 8.89 cm) long. The levers 403 are moved along the hanging brackets 402 from 0.1 inches (approximately 2.54 mm) to 0.3 inches (approximately 7.62 mm) depending on the application, rotating about 2 to 6 degrees. This forces the cold plate to bend a nominal 0.1 inches (approximately 2.54 mm) to 0.5 inches (approximately 12.7 mm) down vertically towards the module 310.

Figure 4D:
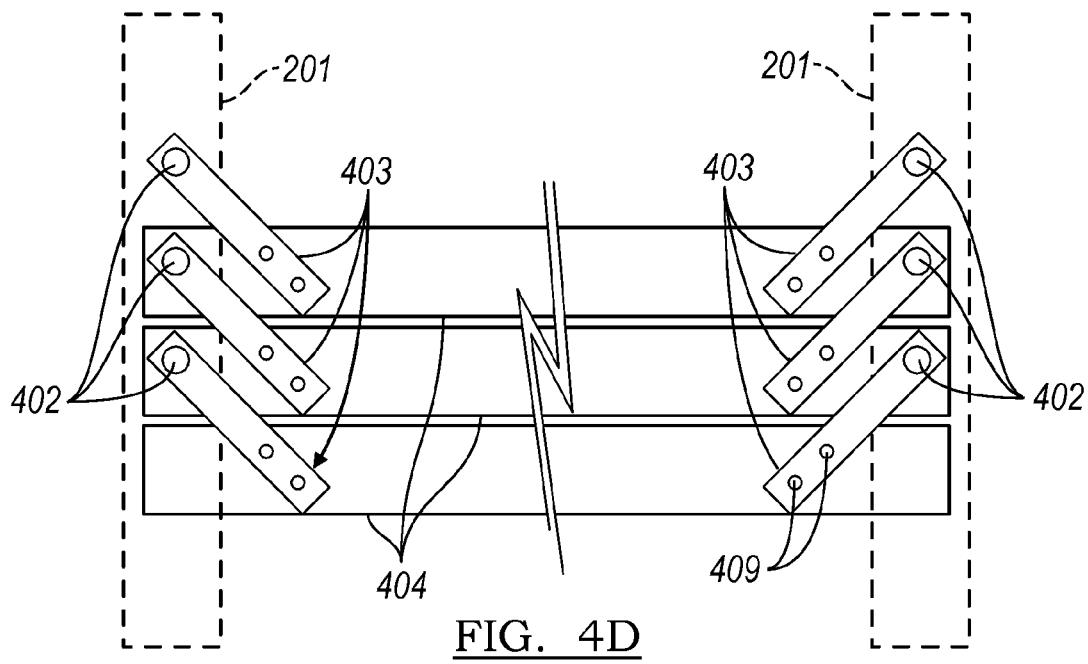
FIG. 4D is a side view of a plurality of exemplary cold plate lever attachments.

The levers 403 on each level are arranged such that levers on adjacent levels do not interfere with one another. This is accomplished by mounting them at an angle as indicated in FIG. 4D, such that no lever interferes with the lever above or below it as it is moved along its respective hanging bracket 402. A plurality of the hanging brackets 402 is attached to the support structure 201 vertically, one above the other. A plurality of connection points 409 attach the levers 403 to the mounting brackets 404 outside the vertical line defined by the hanging brackets 402. As one skilled in the art will readily observe, the hanging brackets 402 may be arranged in other such configurations as "U" shapes to avoid interference by arrangements other than angling. All such lever configurations that avoid interferences are effectively understood as disclosed herein.

With continued reference to FIGS. 4A-4C, a plurality of various types of the module 310 may be envisioned as being suspended below each of the plurality of cold plate shelves 101 on the drawer-type support slides 202. A TIM 411 is introduced between the cold plate 101 and the module 310 by placing it on top of the module 310. In this position, there is a relatively large space, generally 0.1 inches (approximately 2.54 mm) to 0.2 inches (approximately 5.08 mm), between the TIM 411 and the cold plate 101.

When the levers 403 of FIG. 4B are pushed towards one another along the hanging brackets 402, a rotational force is applied, bending the cold plate 101 and the thin flexible steel plate 406 downward towards the module 310 and its attached TIM 411. The bend forms a convex interface surface on the underside of the cold plate 101. When the module 310 is then raised as shown in FIG. 4C, the TIM 411 is forcibly positioned against the cold plate 101. As the module 310 is raised, the now convex cold plate 101 is progressively flattened across the top of the module 310, providing distributed pressure over the large TIM/cold-plate interface, assuring good thermal contact even if the module surface is not completely planar. The convex cold plate incrementally contacts the TIM 411, eliminating trapped air. Flattening the cold plate by such pressure pushes the sides out, lengthening it slightly. This lengthening, from 0.003 inches (approximately 0.076 mm) to 0.03 inches (0.76 mm), is accommodated by compliance of the levers 403. Similarly, when the module 310 is lowered, it also incrementally released, incrementally overcoming any adhesive forces with a minimum of force.

The levers 403 may be permanently fixed in place with the cold plate 101 bent into position and contact made by lifting the module 310 into place. Alternatively, the module 310 may remain at a fixed height and the cold plate 101 brought down onto the module 310 by moving the cold plate 101 downward. Another method is to fix the distance between the module 310 and the cold plate 101, and bend the cold plate 101 with the levers 403 until the cold plate 101 makes contact with the module. Alternatively, a combination of flexion of the cold plate 101 and vertical movement may be used. To simplify operation, one of a pair of the levers 403 may be permanently fixed while only the second of the pair is moved to install or remove the module 310.

One skilled in the art can readily see that the steel plate 406 may be replaced by another material with suitable flexibility and spring. Likewise, other materials may be substituted for aluminum for the tubes. The separate steel spring may be eliminated by properly tempering the tubes such that they have proper spring-like characteristics.

One skilled in the art, upon reading the present disclosure, will recognize there are many possible means to construct the hanging brackets 402 and the levers 403, as well as methods and mechanisms to move the levers 403. The present disclosure is thus meant to be inclusive of all such means, methods, and mechanisms. These include, but are not limited to, constructing the hanging brackets 402 as screw mechanisms, using cam or sliding lever mechanisms, or affixing the hanging brackets 402 to the levers 403, and moving the hanging brackets 402.

Figure 5A:
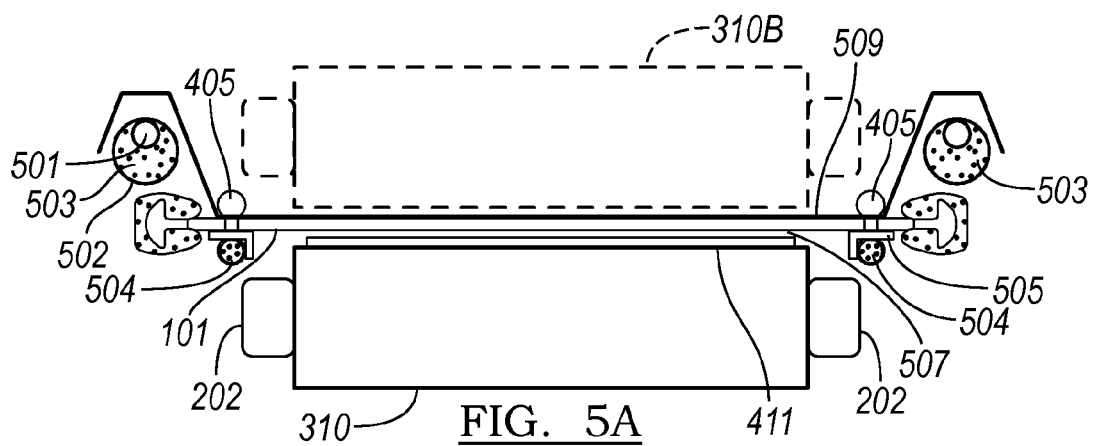
FIG. 5A is a front view of an exemplary cold plate in a neutral flat position over a module.
Figure 5B:
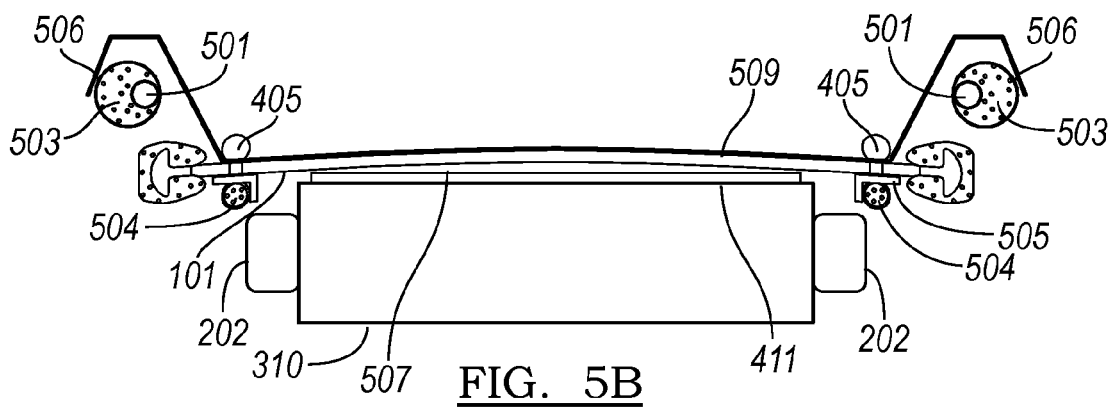
FIG. 5B is a front view of the exemplary cold plate showing the cold plate bending away from module, thereby releasing the module.
Figure 5C:
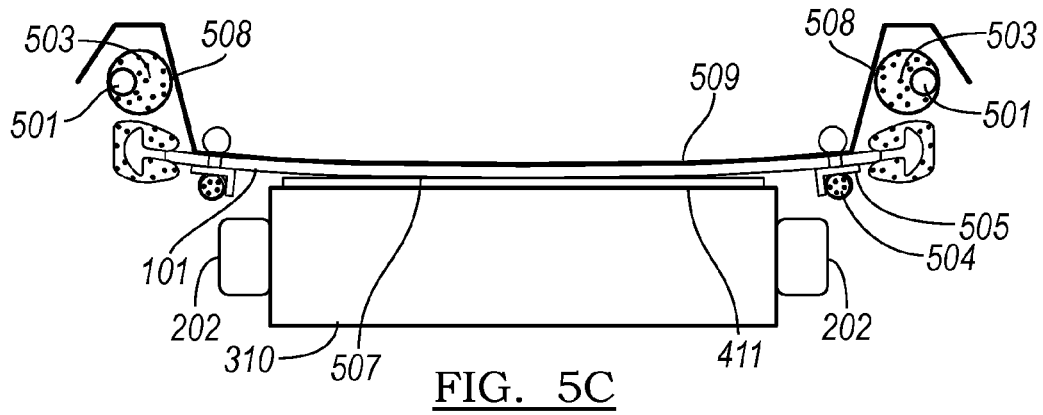
FIG. 5C is a front view of the exemplary cold plate showing the cold plate bending and flattening on the module while simultaneously thermally engaging the module.

FIGS. 5A, 5B, and 5C illustrate other exemplary embodiments to make thermal contact between the cold plate and the module. Entire operating mechanisms for this series of embodiments are less than 2 inches (approximately 5.08 cm) high, fitting within the height of a single module. As shown in FIG. 5A, an operating mechanism for the module 310 resides primarily above the cold plate 101 and alongside a module 310B located immediately above the module 310. Standard 1 U modules (stackable with a 1.75 inch (approximately 4.45 cm) vertical pitch without a cold plate insert) may therefore be stacked with a vertical pitch of 2 inches (approximately 5.08 cm), or less, including the cold plate mechanism.

Similar to the mechanism described in FIGS. 4A-4C, the module 310 is mounted below the cold plate 101 on the drawer-type support slides 202 attached to a support structure (not shown). Affixed to the top of the cold plate 101 is a thin flat steel plate 509 with similar characteristics as described above for the thin flexible steel plate 406. In this embodiment, the thin flat steel plate 509 extends beyond the ends of the cold plate 101 and is formed with integrated levers as shown. The levers are U-bends formed on the edges of the thin flat steel plate 509 that are used to control a bending operation of the cold plate 101. The thin flat steel plate 509 is riveted through spaces in the cold plate 101 to a plurality of bottom steel bars 505 that extend beyond the front and back of the cold plate 101, firmly holding the cold plate 101 sandwiched between the two steel layers.

Further, the thin flat steel plate 509 may be glued to the cold plate 101 to provide extra stiffness. The plurality of bottom steel bars 505 have round steel extensions 504 protruding forward and behind the cold plate 101 such that the round steel extensions 504 pass through horizontal slots in the support structure. These slots (not shown) support the cold plate 101, permitting a horizontal movement and rotation; but limit vertical movement to under 0.01 inches (approximately 0.254 mm). By means of these slots, a space 507 between the underside of the cold plate 101 and the top of TIM 411 can be carefully controlled. The space 507 for this embodiment is between 0.03 inches (approximately 0.762 mm) and 0.15 inches (approximately 3.81 mm).

A camshaft 503 of FIG. 5A is fabricated from a round rod 501 of approximately 0.25 inch (approximately 6.35 mm) in diameter which serves as the axis of rotation of the camshaft 503. A round pipe 502, about 0.75 inches (approximately 19.1 mm) in diameter, mounted off-center around the round rod 501, forms the cam. The round rod 501 is mounted in at least two places to the support structure, fixing its location and limiting its motion to a simple rotation. Dimensions controlling interoperation of the module 310, the cold plate 101, and the camshaft 503 are controlled with a high degree of accuracy by referencing and mounting each of the components on the same support structure (not shown).

Each camshaft 503, in its neutral position, fits snugly under each of the U-bends formed at the extensions of the thin flat steel plate 509, extending out from the front and rear of the steel plate. The round pipe 502 used to form a portion of the camshaft 503 revolves eccentrically around the round rod 501 that functions as the axis shaft. One quarter turn of the camshaft 503 causes the round pipe 502 to press against one of the walls of the U-bend causing a horizontal motion of between 0.2 inches (5.08 mm) and 0.3 inches (7.62 mm) to the right or left, depending on a direction of rotation. The camshaft 503 is turned either manually by a handle (not shown) or by a powered mechanism such as an electric motor (not shown).

The electric motor, if used, can use a reduction gear to give high torque. The electric motor is mounted on the support structure together with limit switches (not shown). The limit switches constrain the camshaft 503 to move about one-half turn in either direction. Two motors may be used, one on each shaft, or a single motor may be connected to both through a drive mechanism, such as a chain.

Other possible actuating mechanisms could be driven by hydraulic or air pressure and provide rotational or linear force. Such mechanisms may be readily designed by one skilled in the art upon reading the material disclosed herein. The designs are considered as being disclosed herein.

With continued reference to FIG. 5A of this embodiment, the rotation of the camshaft 503 is limited to less than 360 degrees such that the largest eccentric excursion of the camshaft cannot face upward. This reduces the required clearance above the camshaft and thus the total height of the mechanism, enabling the 2 inch (approximately 5.08 cm) vertical module pitch to be maintained.

FIG. 5B illustrates a motion of the cold plate 101 when the camshafts 503 are rotated to put pressure on outside portions 506 of the U-bend levers. The plate sides are pushed apart, making the center of the cold plate 101 bow upward away from the module 310, increasing the space 507. This forces the module 310 and the TIM 411 apart, thereby overcoming any residual adhesive force between the two components and assuring sufficient vertical clearance to pull out and remove the module 310 from the support structure.

The camshaft 503 might also be replaced by a sliding mechanism similar to the drawer-type support slide 202 of FIGS. 3A and 3B. The sliding mechanism would be installed on edge (not shown) as compared to the mounting configuration of FIGS. 3A and 3B. In this edge position, slits or pins on the slide could be used to engage the edge of the steel plate 509, moving it side to side in a similar manner as did the camshaft 503.

FIG. 5C illustrates a motion of the cold plate 101 when the camshafts 503 are rotated to put pressure on inside portions 508 of the U-bend levers. Both the compressive forces and rotational torque of this applied pressure force the bottom of the cold plate 101 down until it makes contact with the module 310, eliminating the space 507. If the module 310 were not present, the middle of the cold plate would drop about 0.6 inches (15.2 mm). However, with the module 310 present, the cold plate 101 first contacts the TIM 411 in the center as the camshaft 503 is turned. This contact area then enlarges as the camshaft 503 is turned further, spreading out from the center, progressing towards each side until greater than 90% of the TIM 411 surface is contacting the cold plate 101.

As the surface of the thin flat steel plate 509 cannot go down any farther than the TIM 411, nor can it be compressed, the forces applied by the camshaft 503 are absorbed primarily by a spring action of the members of the U-bend. The temper and spring of the steel plate 509 and the cold plate 101, the degree of motion imparted by the camshaft 503, the length of the moment arm above the steel plate 509 where the camshaft 503 and U-bend meet, the overall dimensions of the cold plate 101 and the steel plate 509, and the distance from the cold plate 101 to the module 310, all interact to determine a vertical force applied between the cold plate and module. A minimum pressure of 0.1 PSI (approximately 689 Pa) should be applied to guarantee good thermal contact between the cold plate 101 and the TIM 411, with a higher pressure desirable. This embodiment can create vertical pressures of about 1 PSI (approximately 6.89 kPa), or more, over a module surface area of 400 square inches (approximately 0.258 m$^2$).

Figure 5D:
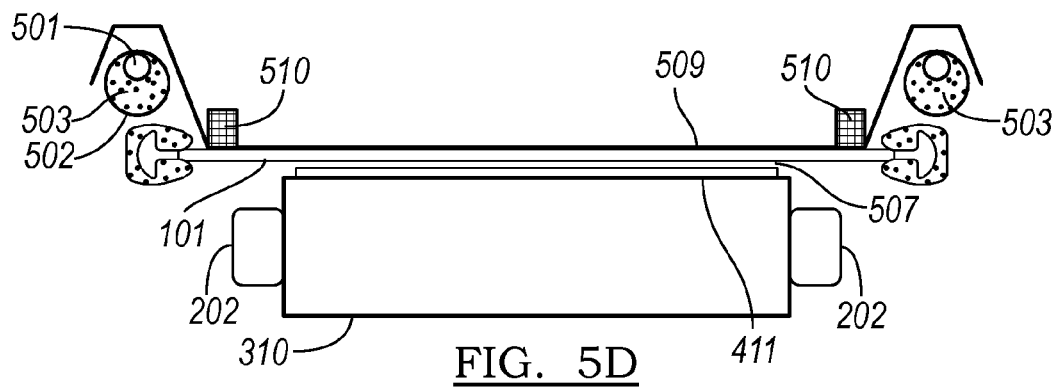
FIG. 5D is a front view of an exemplary cold plate in a neutral flat position over a module having a different engagement and disengagement mechanism from the mechanism of FIG. 5A.

FIG. 5D illustrates another embodiment of the construction illustrated in FIG. 5A. Components including the fasteners 405, the round steel extensions 504, and the plurality of bottom steel bars 505 are eliminated. A plurality of rectangular rods 510 is placed above the thin flat steel plate 509, extending into the front and back of the support structure (not shown). The support structure thus holds each of the plurality of rectangular rods 510 firmly in place. As the steel plate 509 is flexed inward by the camshaft 503 in a first position 508 as shown in FIG. 5C, bending downward onto the module 310 as described above with reference to FIG. 5C, the top of the steel plate 509 reacts by trying to rise upward. The steel plate 509 is restrained on each side by the plurality of rectangular rods 510 thereby exerting downward force on the module 310, flattening out across the top of module 310 as described earlier.

When the camshaft 503 is rotated outward and upward to a second position 506 as shown in FIG. 5B, the steel plate 509 is flexed outward, creating an upward bow as described earlier with reference to FIG. 5B, and lifted away from the module 310. In this case, the one or more flat tubes 102 of FIGS. 1A-1C need to be attached to the steel plate 509 so as to be lifted by it. Note that the one or more flat tubes 102 and the steel plate 509 are bent at different radii and therefore cannot be firmly attached to each other without casing undo stiffness. At least three different exemplary methods may be employed for lifting the tubes. Although not described in detail, a skilled artisan can readily envision each method based upon reading the material disclosed herein.

Figure 5E:
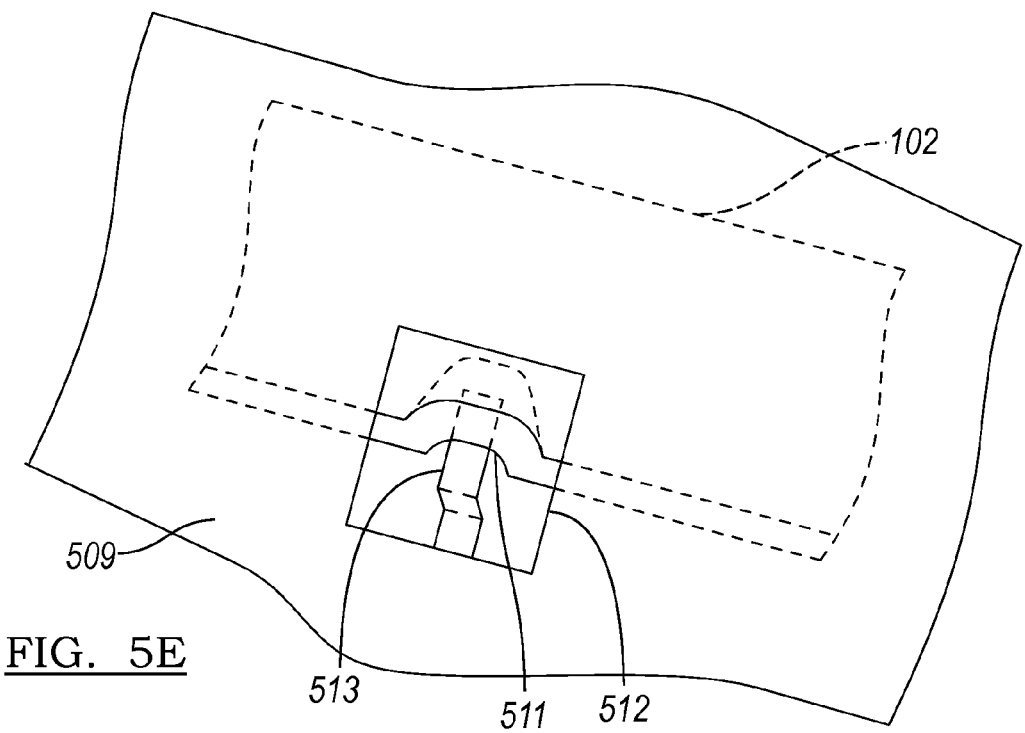
FIG. 5E is a detail view of an exemplary tube to plate/tube engagement mechanism.

First (not shown), the tubes can be attached to the steel plate 509 by spot gluing along a mutual center line. Second (not shown), a bracket may be attached to the top of the tubes such as by gluing or brazing with the brackets loosely mating to receptors in the plates. Third, the tubes may be bent or embossed upward in a small area and a tab from the plates bent under the tubes, engaging the tubes as shown in FIG. 5E. FIG. 5E illustrates a portion of the steel plate 509 overlying a portion of the tube 102. The plate 509 has a hole 512 cut therein. A tab 513 extends from the edge of the hole 512, bending under an embossing 511 in the plate 509.

Figure 6:
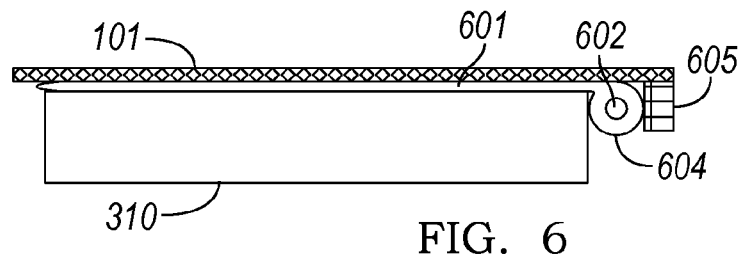
FIG. 6 is a side view of a fluid-filled pouch functioning as an exemplary Thermal Interface Material (TIM) between the module and the cold plate.

With reference now to FIG. 6, an alternative means is illustrated wherein sliding rails are conventionally fixed and the module 310 is not lifted nor the cold plate 101 moved or bent. A small gap between the module 310 and the associated cold plate 101 above is filled with an expandable pouch 601 constructed from a thermally conductive material and having an elongated bulb 604 at one end. A compressible tube 602, filled with air or other gas, is located in the elongated bulb 604. The remainder of the expandable pouch 601 is substantially filled with a thermally conductive fluid.

Prior to the module 310 being slid into the cooling framework, the expandable pouch 601 is placed either within the support structure under the associated shelf or directly on the top of the module 310 with the rear end of the pouch 601 overlapping the end of the module 310. During or after the module 310 being slid into place, the elongated bulb 604 at the end of the pouch 601 is compressed against a block 605 at the rear of the shelf. The elongated bulb 604 is compressed either by the rear of the module 310 or by a lever (not shown) that operates independently of the module 310.

The compression forces the thermally conductive fluid to flow into the pouch 601, expanding it and forcing its sides against the cold plate 101 and the module 310 filling the small gap. If the gap is filled prior to the module 310 or lever reaching the end of its travel, the compressible tube 602 within the elongated bulb 604 contracts, thus absorbing excess fluid.

Alternatively, in place of the elongated bulb 604 providing compliance, the block 605 may be designed to offer a needed compliance by other means such as a spring (not shown) that limits how much force may be applied to the fluid in the expandable pouch 601. Other means to force the fluid in the pouch 601 between the module 310 and the cold plate 101, such as inflating the compressible tube 602, are readily discernible to one skilled in the art upon reading the material disclosed herein and are thus considered as being within a scope of the present disclosure.

In a specific exemplary embodiment, the thermally conductive material filling the pouch 601 is an electrically non-conductive and slightly viscous fluid that will not readily flow out of the pouch 601 should the pouch 601 be pierced or otherwise damaged. The electrically non-conductive fluid will therefore not damage any electronic equipment that any leaking fluid may contact.

When the module 310 is in place, the pressure of the enclosed fluid keeps the pouch 601 firmly lodged between the module 310 and the cold plate 101. Initiating any movement of the module 310 or releasing the lever that compresses the module 310 will reduce the pressure of the fluid in the pouch 601 making the module 310 easily removable.

Figure 7:
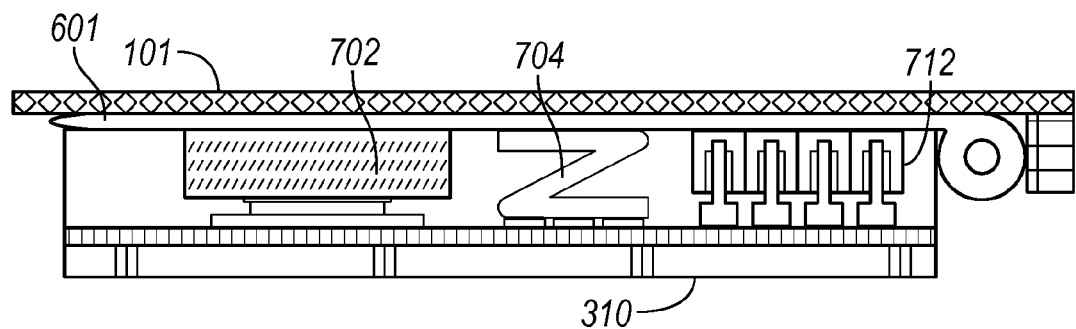
FIG. 7 is a side view of a fluid-filled pouch functioning as an exemplary TIM between various module components and the cold plate.

Alternatively, the pouch 601 may be used in place of a conventional lid that may otherwise be attached to the module 310. FIG. 7 shows the expandable pouch 601 in direct contact with a plurality of electronic component thermal interfaces 702, 704, 712 in the module 310.

Although the description given above generally locates the modules below the adjacent cold plates and elevated to contact the cold plates, any proximate mounting of the module to a cold plate, including above a horizontal cold plate or alongside a vertically mounted cold plate are considered with a scope of the present disclosure. One or more modules (of the same or a plurality of sizes) may also be mounted on opposite sides of the same cold plate. Additionally, the cold plate may be larger than the module such that multiple modules may be mounted on the same cold plate. Conversely, the cold plate may be smaller than the module.

Figure 8:
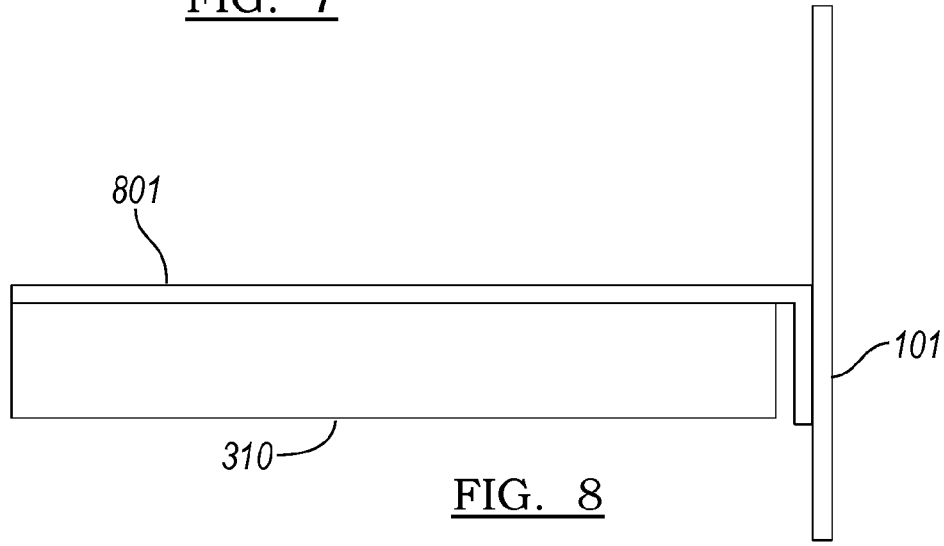
FIG. 8 is a side view utilizing an exemplary flat heat pipe as a second cold plate.

In another exemplary embodiment shown in FIG. 8, a flat heat pipe 801 is employed as a secondary cold plate. The flat heat pipe 801 is secured to the module 310 side such that components and subassemblies internal to the module 310 are thermally attached to the flat heat pipe 801. The thermal attachment can occur either by attaching the heat pipe 801 to a side of the module 310, or by using the heat pipe 801 as a lid replacement in a manner similar to the expandable pouch 601 description given with reference to FIG. 7, above. The flat heat pipe 801 includes a section that extends beyond the module side that is moved into thermal contact with the cold plate 101 when the module 310 is inserted.

The heat pipe 801 may extend straight beyond the module 310 making contact to the first cold plate in the same plane as the module side to from which heat is extracted. Alternatively, the heat pipe 801 may bend around a second side of the module 310 as shown in FIG. 8, making thermal contact with the cold plate 101 mounted orthogonally to the first side of the module 310. The bend acts as a flexible spring whereby the first and second cold plates are thermally attached by pressure exerted by the spring action. A TIM (not shown) may be affixed between the first and second cold plates.

The intersection of the module 310 and surfaces of the cold plate 101 may be too irregular to form a good thermal contact even with the above described means and methods. Conventional TIMs constructed as thermally conducting sheets of material are either not highly compressible due to the thermal material fillers, or do not have a high thermal conductivity if they are highly compressible at the applied forces described herein. Thermally conductive grease will flow out of larger spaces and is difficult to apply and constrain within the prescribed locus of application.

Figure 9:
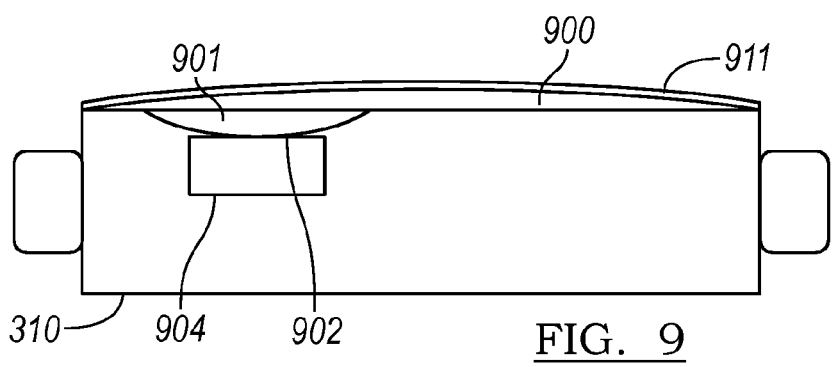
FIG. 9 is an exemplary embodiment of a TIM placed above a module and constructed as a sandwich of a thermal pad and thermal fluid.

Referring now to FIG. 9, one or more thermally conducting sheets comprising a first TIM 911 and thermally conducting grease 900 provide a highly compliant thermal interface. The thermally conducting grease 900 is applied in a layer about 0.01 inches (approximately 0.254 mm) thick, more or less depending upon application, but thick enough to readily flow with applied pressures as described herein, to the top area of the module 310 that is to be thermally attached to an adjacent cold plate (not shown directly). A frame of about one-half inch (approximately 12.7 mm) where no grease is applied is left around the edges of the top area of the module 310. The first TIM 911, with its one adhesive side down, is placed over the entire area including the frame such that it entirely seals the thermally conducting grease 900 underneath. When the cold plate is engaged with the module 310, the thermally conducting grease 900 will flow from the highly compressed areas into any thermal voids, filling these voids and creating a high quality thermal interface.

In an exemplary embodiment, a viscosity of the thermally conducting grease 900 is in a range of 20,000 to 200,000 centipoise (20 to 200 Newton-sec/m$^2$). In a specific exemplary embodiment, a viscosity of the thermally conducting grease 900 is nominally about 100,000 centipoise (100 Newton-sec/m$^2$).

One skilled in the art will realize the thermal interface as described herein has applications beyond cooling an external surface of a module. The thermal interface can be used to thermally couple any two surfaces. For example, a component or subassembly internal to the module that requires cooling can separately or additionally thermally connected to the interior side of the module using such a thermal interface.

With continued reference to FIG. 9, an additional set of one or more thermally conducting sheets comprising a second TIM 902, is mounted to the underside of the module top area over a device 904 requiring cooling. Thermally conducting grease 901 is deposited between the sheet and the module. Further, holes (not shown) may be drilled in the module top to thermally couple the thermally conducting greases 900, 901. The holes allow the grease to flow freely between the top side and underside of the module, moving to the areas of lesser contact, improving thermal connection, and conductivity between the cold plate and internal components. Alternatively, the grease could be enclosed in a sealed pouch, such as the expandable pouch 601 described with reference to FIG. 6.

Additionally, with reference again to FIG. 1B, any space existing between the one or more flat tubes 102 allows room for excess grease to flow, potentially reducing the grease thickness, and thereby the thermal resistance, between the cold plate 101 and the module 310 to a minimum, thereby ensuring good thermal contact.

Although various embodiments have been described herein, it will be evident that various modifications and changes may be made to these embodiments without departing from the broader spirit and scope of various forms of the present invention. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually or collectively, by the term "invention" merely for convenience and without intending to voluntarily limit the scope of this application to any single invention or inventive concept if more than one is, in fact, disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of the various embodiments. Combinations of the above embodiments, and other embodiments not specifically described herein, will be apparent to those of skill in the art upon reviewing the above description.

For example, particular embodiments describe various arrangements, dimensions, materials, and topologies of systems. Such arrangements, dimensions, materials, and topologies are provided to enable a skilled artisan to comprehend principles of the present disclosure. Thus, for example, numerous other materials and arrangements may be readily utilized and still fall within the scope of the present disclosure. Additionally, a skilled artisan will recognize, however, that additional embodiments may be determined based upon a reading of the disclosure given herein.

What is claimed is:

1. A system to provide cooling to an electronic component, the system comprising:
   a flexible cold plate that thermally couples to the electronic component, the flexible cold plate having a passageway configured to allow a cooling fluid to flow therein;
   an input header coupled to a first end of the passageway to allow entry of the cooling fluid;
   an output header coupled to a second end of the passageway to allow exit of the cooling fluid;
   a coupling mechanism to couple the input header and the output header to an external system to circulate the cooling fluid; and
   a force application mechanism that translates a rotational force into a substantially distributed normal force across a face of the flexible cold plate, wherein the normal force brings the flexible cold plate into thermal contact with the electronic component.

2. The system of claim 1, further comprising a thermal interface material configured to couple the electronic component to the flexible cold plate to increase a heat transfer therebetween.

3. The system of claim 2, wherein a space between the flexible cold plate and the thermal interface material coupled to the electronic component is between 0.03 inches and 0.15 inches when the electronic component is inserted in a support structure.

4. The system of claim 1, wherein the electronic component is selected from the group consisting of compute servers, data storage, switches, routers, and power conversion units.

5. The system of claim 1, wherein a thermal resistance from the cooling fluid to a coupled electronic component is less than two $°C./W/in^2$.

6. The system of claim 1, wherein the flexible cold plate is comprised of a flat tube.

7. The system of claim 1, wherein the flexible cold plate is comprised of a plurality of flat tubes.

8. The system of claim 7, wherein ends of the plurality of flat tubes terminate in manifolds.

9. The system of claim 1, further comprising a mounting means for providing incremental separation between a mounted electronic component and the flexible cold plate, thereby overcoming any adhesive forces with a minimum of force.

10. The system of claim 9, wherein the mounting means is a slider configured to first slide the mounted electronic component into a support structure and then position the mounted electronic component against the flexible cold plate.

11. The system of claim 1, wherein the flexible cold plate is operable in two modes: a first mode of the two modes, wherein the flexible cold plate bends to form a surface towards the electronic component; and a second mode of the two modes wherein the flexible cold plate bends away from the electronic component.

12. The system of claim 11, wherein the flexible cold plate has an attached steel plate with integrated levers for controlling an amount of the bend of the flexible cold plate.

13. The system of claim 1, further comprising a flat flexible heat pipe acting as a second cold plate to conduct heat from the electronic component to the flexible cold plate.

14. The system of claim 1, wherein the force application mechanism is a flexible plate operable in two modes:
   a first mode of the two modes, wherein a flexible plate presents a surface to the electronic module; and
   a second mode of the two modes, wherein the flexible plate applies a substantially normal force to the flexible cold plate, thermally contacting the flexible cold plate with the electronic module;
wherein the flexible plate transitions between the first mode and second mode in response to the rotational force applied to edges of the flexible plate.

15. A method of cooling an electronic equipment module, the method comprising:
   placing the electronic equipment module in proximity to a flexible cold plate in a support structure;
   coupling the flexible cold plate to an external cooling system;
   circulating cooling fluid between the external cooling system and internal passageways of the flexible cold plate; and
   applying a substantially equal force across a face of the flexible cold plate in response to an applied rotational force.

16. The method of claim 15, further comprising bringing the electronic equipment module into thermal contact with the flexible cold plate by:
   inserting the electronic equipment module horizontally into the support structure without contact between the electronic equipment module and the flexible cold plate; and
   moving either the electronic equipment module or the flexible cold plate towards one another, thereby bringing the electronic equipment module and the cold plate into thermal contact with one another without a sliding motion between the electronic equipment module and the flexible cold plate.

17. The method of claim 15, further comprising bringing the electronic equipment module into thermal contact with the flexible cold plate incrementally, thereby expelling excess air between the module and the flexible cold plate.

18. The method of claim 15, further comprising inserting an inflatable pouch filled with a thermally conductive fluid between the electronic equipment module and the flexible cold plate.

19. The method of claim 15, further comprising bending a portion of the flexible cold plate to thermally contact the electronic equipment module.

20. A system to cool an electronic component within an electronic module, the system being arranged such that the electronic module is hand-mountable to the system, the system comprising:
   a first flexible coldplate thermally coupled to the electronic component, wherein the first flexible coldplate cools the electronic component, the first flexible coldplate having a passageway to allow a cooling fluid to flow therein;
   a plate substantially coupled to an entire first face of the first flexible coldplate;
   a thermal interface material including an encapsulated layer of a thermally conducting grease, the thermal interface material coupled between a second face of the first flexible coldplate and the electronic component, the thermal interface material to thermally couple the first flexible coldplate to the electronic component to increase the heat transfer therebetween as pressure is applied from the plate toward the electronic component; and
   a mechanism to provide a space between the first flexible coldplate and the electronic component to assist in insertion or removal of the electronic module, the mechanism further imparting a compressive, substantially equally distributed force substantially normal to a face of the plate, the compressive force to substantially flatten the first flexible coldplate and the thermal interface material against the electronic component, thereby causing the thermal interface material to conform to the space between the first flexible coldplate and the electronic component to increase the heat transfer between the flexible coldplate and electronic component.

21. The system of claim 20, wherein the plate is a flexible plate coupled to the mechanism to impart a rotational force and the compressive force to the flexible plate, wherein the imparted rotational force bends and forms a surface towards the electronic component in the first flexible coldplate coupled to the flexible plate, the compressive force to resist flattening the surface by an application of the compressive force substantially parallel to the electronic component to be cooled, the surface being formed in a direction towards the electronic component to impart the compressive force between the electronic component and the surface of the first flexible coldplate.

22. The system of claim 21, wherein the mechanism comprises a cam mechanism to impart the rotational force and the compressive force.

23. The system of claim 21, wherein the mechanism is configured to bend the flexible plate between approximately 2.5 mm and 12.7 mm.

24. The system of claim 21, wherein the flexible plate has an integrated lever to control an amount of the bend of the flexible plate.

25. The system of claim 20, wherein the first flexible coldplate is comprised of a flat tube forming the passageway, the system further comprising:
- an input header coupled to a first end of the passageway to allow entry of the cooling fluid;
- an output header coupled to a second end of the passageway to allow exit of the cooling fluid; and
- a coupling mechanism to couple the input header and the output header to an external system to circulate the cooling fluid.

26. The system of claim 20, wherein the space between the first flexible coldplate and the thermal interface material is configured to be between approximately 0.7 mm and 3.8 mm when the electronic module is inserted in a support structure of the system.

27. The system of claim 20, further comprising forming an adhesive frame around a periphery of one side of the thermal interface material to seal a layer of the thermally conducting grease approximately 0.25 mm thick between the electronic module and the thermal interface material to provide a compliant thermal interface over a range of thickness variations of the electronic module.

28. The system of claim 20, wherein a thermal resistance from the cooling fluid to the electronic module is configured to be less than approximately $0.3°$ C./W/cm$^2$.

29. The system of claim 20, wherein the electronic module is manually mountable to the system.

30. The system of claim 20, wherein the mechanism further provides an incremental separation between the electronic components and the first flexible coldplate to overcome an adhesive force developed between the electronic component and the first flexible coldplate.

31. The system of claim 20, further comprising a slider mechanism configured to mount and slide the electronic module into a support structure.

32. The system of claim 31, further comprising a second electronic module, wherein the slider mechanism mounts the second electronic module in parallel with the first electronic module in the support structure of the system.

33. The system of claim 20, further comprising a flat flexible heat pipe acting as a second coldplate to conduct heat from the electronic module to the first flexible coldplate.

34. The system of claim 20, wherein the electronic component is cooled indirectly by coupling the electronic module to the first flexible coldplate.

35. The system of claim 20, wherein the thermally conducting grease has a viscosity range of 20 to 200 Newton-sec/m$^2$.

36. The system of claim 20, wherein the thermally conducting grease has a viscosity range of about 100 Newton-sec/m$^2$.

37. A method of hand-mounting and cooling an electronic module containing an electronic component, the method comprising:
- providing a space between a flexible coldplate and the electronic component to assist in insertion or removal of the electronic module by using a mechanism;
- coupling the electronic component to the flexible coldplate for cooling the electronic component, the flexible coldplate having at least one passageway allowing a cooling fluid to flow therein;
- coupling substantially an entire first face of the flexible coldplate to a plate;
- coupling a thermal interface material including an encapsulated layer of a thermally conducting grease between a second face of the flexible coldplate and the electronic component, the thermal interface material thermally coupling the electronic component to the flexible coldplate; and
- applying pressure from the plate toward the electronic component, thereby increasing the heat transfer therebetween; and imparting a compressive force substantially normal to a face of the plate by using the mechanism, the compressive force substantially flattening the flexible coldplate and the thermal interface material against the electronic component, thereby conforming the thermal interface material to a space between the flexible coldplate and the electronic component, increasing the heat transfer between the flexible coldplate and the electronic component.

38. The method of claim 37, further comprising imparting, by a human operator using the mechanism, a rotational force and the compressive force to the plate coupled to the flexible coldplate, wherein the plate is flexible and the imparted rotational and compressive forces bend and form a surface in the flexible plate, the surface operable in two modes, wherein a first mode of the two modes, the flexible plate moves the coupled flexible coldplate towards the electronic component; and a second mode of the two modes, the flexible plate moves the coupled flexible coldplate away from the electronic component.

* * * * *

UNITED STATES PATENT AND TRADEMARK OFFICE
CERTIFICATE OF CORRECTION

PATENT NO.        : 8,000,103 B2
APPLICATION NO.   : 12/339583
DATED             : August 16, 2011
INVENTOR(S)       : Robert J. Lipp et al.

It is certified that error appears in the above-identified patent and that said Letters Patent is hereby corrected as shown below:

In column 5, line 26, "2°C./W/in$^2$" should read --2°C/W--
In column 5, lines 26-27, "(approximately 0.31°C./W/cm$^2$)" should read --(approximately 0.31°C./W/)--
In column 5, line 36, "0.5°C./W/in$^2$" should read --0.5°C/W--
In column 5, lines 36-37, "(approximately 0.078°C./W/cm$^2$)" should read --(approximately 0.078°C./W/)--
In column 17, line 15, "two °C./W/in$^2$" should read --two °C./W--
In column 19, line 34, "0.3°C./W/in$^2$" should read --0.3 °C./W--

Signed and Sealed this
Twenty-ninth Day of January, 2013

David J. Kappos
*Director of the United States Patent and Trademark Office*